United States Patent
Baba et al.

(10) Patent No.: US 9,449,920 B2
(45) Date of Patent: Sep. 20, 2016

(54) ELECTRONIC DEVICE

(71) Applicant: Sumitomo Electric Industries, Ltd., Osaka-shi (JP)

(72) Inventors: Osamu Baba, Yokohama (JP); Takeshi Kawasaki, Yokohama (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/792,816

(22) Filed: Jul. 7, 2015

(65) Prior Publication Data
US 2016/0013130 A1   Jan. 14, 2016

(30) Foreign Application Priority Data

Jul. 9, 2014  (JP) ................. 2014-141421
May 15, 2015  (JP) ................. 2015-100020

(51) Int. Cl.
| | |
|---|---|
| *H01L 23/64* | (2006.01) |
| *H01L 23/528* | (2006.01) |
| *H01L 23/66* | (2006.01) |
| *H01L 23/522* | (2006.01) |
| *G01R 31/26* | (2014.01) |
| *H01L 21/66* | (2006.01) |

(52) U.S. Cl.
CPC .......... *H01L 23/528* (2013.01); *H01L 23/522* (2013.01); *H01L 23/66* (2013.01); *G01R 31/2644* (2013.01); *H01L 22/32* (2013.01); *H01L 2223/6611* (2013.01)

(58) Field of Classification Search
CPC .......................... H01L 22/32; G01R 31/2644
USPC ..................................... 257/48, 773
See application file for complete search history.

(56) References Cited

U.S. PATENT DOCUMENTS

| | | | | |
|---|---|---|---|---|
| 5,311,122 A | * | 5/1994 | Fullerton | G01R 31/2886 324/754.03 |
| 6,252,266 B1 | * | 6/2001 | Hoshi | H01L 23/481 257/276 |
| 2006/0264040 A1 | * | 11/2006 | Takada | H01L 23/5222 438/667 |

FOREIGN PATENT DOCUMENTS

JP           6-334004 A           2/1994

* cited by examiner

*Primary Examiner* — George Fourson, III
(74) *Attorney, Agent, or Firm* — Venable LLP; Michael A. Sartori; David M. Klecyngier

(57) ABSTRACT

An electronic device is disclosed. The electronic device comprises a transistor provided on a substrate, a transmission line provided on the substrate and connected to the transistor, an electrode pad connected to the transmission line, and a connection wiring electrically connecting the electrode pad and the transmission line through a first wiring and a second wiring. Both of the first wiring and the second wiring are connected to different positions of the electrode pad.

9 Claims, 19 Drawing Sheets

ELECTRONIC DEVICE

TECHNICAL FIELD

The present invention relates to an electronic device.

BACKGROUND

A test for evaluating various characteristics is conducted on a field effect transistor (FET) and a functional circuit or the like provided inside an electronic device such as a semiconductor integrated circuit. Examples of the test include an RF test of evaluating an RF characteristic (high frequency characteristic) of the FET or the like by connecting a probe electrode (an RF probe) to a pad for signal input of the electronic device.

For example, in Japanese Patent Application Laid-Open No. H06-334004, a technology of conducting the RF test on a microwave integrated circuit (MMIC: Monolithic Microwave Integrated Circuit) covered with a grounded shield metal is known. The RF test is conducted in a condition close to a condition when the MMIC is mounted on a package.

SUMMARY

Meanwhile, in the RF test, the RF probe is normally brought into contact with an RF pad of the electronic device by a manual operation. There occurs variation in a contact part where the RF probe and the RF pad contact each other, and a line length from the contact part to the FET or the like served as an evaluation target changes. In this case, when the RF test is conducted on the electronic device used in a millimeter wave band, the RF characteristic of the tested FET varies depending on the above line.

One aspect of the present invention may be to provide an electronic device for suppressing variation of an evaluation result even in the case that the RF test is conducted by a manual operation.

One aspect of the present invention relates to an electronic device comprising a transistor provided on a substrate, a transmission line provided on the substrate and connected to the transistor, an electrode pad connected to the transmission line, and a connection wiring electrically connecting the electrode pad and the transmission line through a first wiring and a second wiring, wherein both of the first wiring and the second wiring are connected to different positions of the electrode pad.

According to one aspect of the present invention, there can be provided an electronic device, for example, in which variation of an evaluation result is suppressed even in the case that an RF test is conducted by a manual operation.

DETAILED DESCRIPTION

Figure 1:
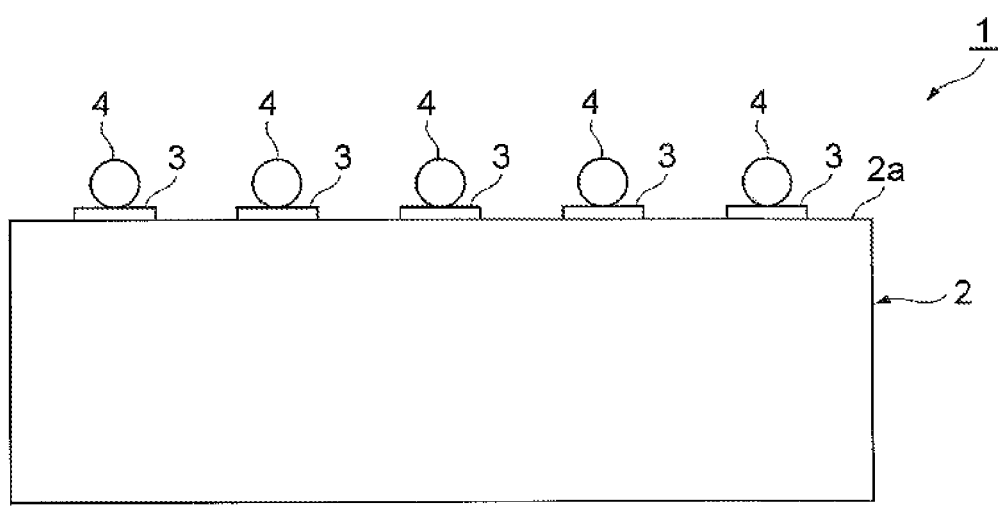
FIG. 1 is a side view of an electronic device according to an embodiment of the present invention.

Description of Embodiment of the Claimed Invention

First of all, embodiments of the invention of the subject application will be described as enumerated below. An electronic device according to an embodiment of the present invention comprises: a transistor provided on a substrate, a transmission line provided on the substrate and connected to the transistor, an electrode pad connected to the transmission line, and a connection wiring electrically connecting the electrode pad and the transmission line through a first wiring and a second wiring, wherein both of the first wiring and the second wiring are connected to different positions of the electrode pad.

In this electronic device, the transmission line connected to the transistor is connected to the electrode pad through the connection wiring including the first wiring and the second wiring. In the case that an RF probe is brought into contact with the electrode pad and an RF characteristic of the transistor is evaluated, the RF probe is connected to the transmission line through the first wiring, and is also connected to the transmission line through the second wiring. Both of the first wiring and the second wiring are connected to different positions of the electrode pad. In this case, a line length from a contact part where the electrode pad and the RF probe are in contact with each other to the transmission line is a composite value of impedance of a line through the first wiring and impedance of a line through the second wiring. Furthermore, the composite value is a parallel value of the line lengths of both lines. Therefore, even when the contact part deviates from a center part of the electrode pad, the impedance based on the line from the contact part to the transmission line becomes the parallel value of the impedance relating to two routes, and the impedance is hardly varied. Thus, even in the case that an RF test is conducted by a manual operation, variation of an evaluation result of the RF characteristic is suppressed.

The first wiring and the second wiring may be connected in parallel between the electrode pad and the transmission line. In this case, the line length through the first wiring and the line length through the second wiring are easily discriminated.

The first wiring and the second wiring may be larger in an inductor component per unit length than the transmission line.

The transmission line may include one end connected to the transistor and the other end connected to the electrode pad, the first wiring may be connected to a first part positioned on a side of the one end of the transmission line with respect to a center part of the electrode pad, and the second wiring may be connected to a second part positioned on an opposite side to the side of the one end of the transmission line with respect to the center part of the electrode pad. In this case, an area of the contact part where the line length through the first wiring and the line length through the second wiring are the same becomes smaller, and variation of the line length effectively becomes smaller.

The first wiring and the second wiring may be point-symmetrical with respect to the center part of the electrode pad, or line-symmetrical with respect to a straight line, and the straight line may extend in a direction orthogonal to the transmission line and may pass through the center part of the electrode pad. In this case, a line length from the center part of the electrode pad to the first wiring becomes equal to a line length from the center part of the electrode pad to the second wiring. Thus, the variation of the impedance becomes even smaller.

The first wiring and the second wiring may be of the same length as each other. In this case, the variation of the impedance becomes even smaller.

Each of the first wiring and the second wiring may include a via.

A solder ball configured to connect the transistor to an external device may be provided on a part of the electrode pad.

Details of Embodiment of the Claimed Invention

Specific examples of an electronic device of the present invention will be described below with reference to the accompanying drawings. It should be noted that the present invention is not limited to these examples but shown in the claims, and it is intended that all modifications that come within the meaning and range of equivalence to the claims should be embraced herein. In the description, the same elements or elements having the same function are denoted with the same reference signs, and an overlapping description will be omitted.

FIG. 1 is a side view of the electronic device according to the present embodiment. As illustrated in FIG. 1, an electronic device 1 includes a body 2 and external terminals 3. The electronic device 1 is an MMIC, for example. The body 2 has a roughly rectangular planar shape, for example, and is loaded with various kinds of functional circuits including wirings and transistors which will be described later. The external terminals 3 are positioned on a principal surface 2a of the body 2 in order to connect the functional circuit inside the body 2 and an external device such as a wiring board. Each external terminal 3 is a conductive layer that has a roughly rectangular planar shape or a circular planar shape, for example, and made of gold (Au). The external terminal 3 may be provided with a spherical solder ball 4 made of a conductive material of a metal such as tin, silver, copper or an alloy thereof, far example. In this case, the external terminal 3 may be connected to the external device through the solder ball 4.

Figure 2:
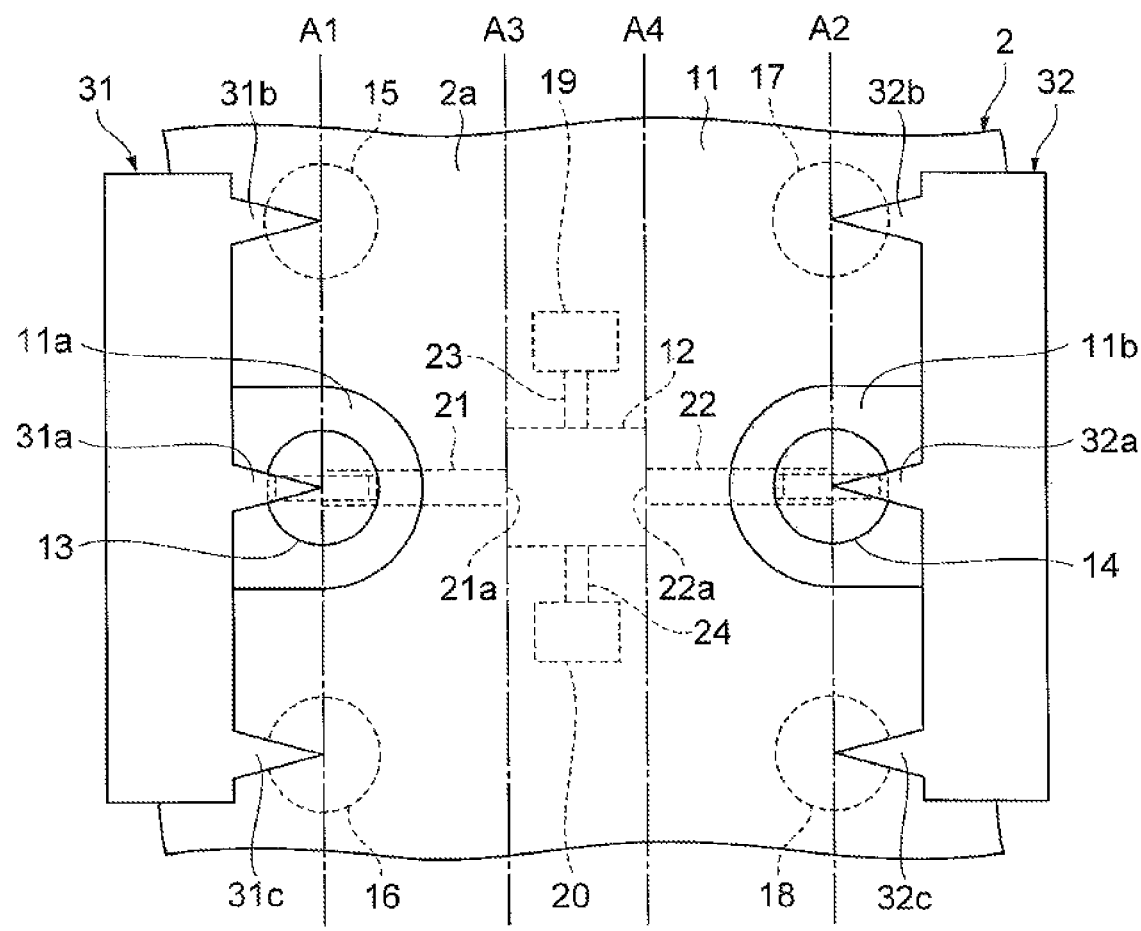
FIG. 2 is a plan view illustrating a state in which the electronic device according to the present embodiment is connected to an RF probe.

FIG. 2 is a plan view illustrating a state in which the electronic device according to the present embodiment is connected to an RF probe. As illustrated in FIG. 2, the body 2 includes a reference pattern 11, a transistor 12, RF pads (electrode pads) 13 to 18, DC pads 19 and 20, signal lines 21 and 22, and wirings 23 and 24.

The reference pattern 11 is provided on the almost entire principal surface 2a, and is a conductive layer made of gold (Au), for example. Therefore, the electronic device 1 is a surface mount MMIC. The reference pattern 11 has a reference potential, and is electrically insulated from the RF pads 13 and 14. On the principal surface 2a, a gap 11a is provided between the reference pattern 11 and the RF pad 13, and a gap 11b is provided between the reference pattern 11 and the RF pad 14.

The transistor 12 is an FET including a gallium-arsenide (GaAs)-based semiconductor material, a gallium-nitride (GaN)-based semiconductor material, or a silicon (Si)-based semiconductor material as a channel, for example. On the principal surface 2a, the transistor 12 is connected to: the RF pad 13 through the signal line 21; the RF pad 14 through the signal line 22, to the DC pad 19 through the wiring 23; and the DC pad 20 through the wiring 24. Each of the wirings 23 and 24 is connected to different surfaces which are different from the surface where the transistor 12 is connected to the RF pad 13 or 14. For example, a gate of the transistor 12 is connected to the RF pad 13, a drain of the transistor 12 is connected to the RF pad 14, and a source of the transistor 12 is connected to the DC pads 19 and 20. It is noted that "connection" in this specification implies not only direct connection but also electrical connection and functional connection.

The RF pads 13 to 18 are the conductive layer equivalent to the external terminal 3 in FIG. 1, and have a circular planar shape. For example, a first potential is inputted to the RF pad. 13, and a second potential is inputted to the RF pad 14. The RF pads 15 to 18 are connected to the reference pattern 11. Similarly, the DC pads 19 and 20 are also connected to the reference pattern 11. The RF pad 13, the transistor 12, and the RF pad 14 are arranged in order along one direction. The RF pads 15, 13 and 16 are arranged in order along a direction orthogonal to the one direction. Similarly, the RF pads 17, 14 and 18 are arranged in order along the direction orthogonal to the one direction. The RF pads 13 and 14 are formed of the same conductive film as the reference pattern 11. The RF pads 15 to 18 and the DC pads 19 and 20 may be a part of the reference pattern 11.

Probe heads 31 and 32 are electrodes for conducting an RF test of the transistor 12 on the body 2. The probe head 31 is connected to the RF pads 13, 15 and 16, and the probe head 32 is connected to the RF pads 14, 17 and 18. An interval of the probe heads 31 and 32 is fixed, and transmission impedance of a wiring pattern (not shown in the figure) formed on the probe heads 31 and 32 is set at 50Ω, for example.

The probe head 31 includes probes 31a to 31 c. The probe 31a is connected to the RF pad 13, the probe 31b is connected to the RF pad 15, and the probe 31c is connected to the RF pad 16. A high frequency signal having the first potential is inputted to the probe 31a, and the reference potential is inputted to the probes 31b and 31 c. Since the probes 31a to 31c are of the same shape as each other, positions at which the probes 31a, 31b and 31c and the RF pads 13, 15 and 16 are in contact with each other respectively are positioned on a straight line A1 orthogonal to an extending direction of a transmission line 46 in FIG. 4 which will be described later. It is noted that in the present embodiment, the straight line A1 passes through center parts of the RF pads 13, 15 and 16.

The probe head 32 includes probes 32a to 32c. The probes 32a, 32b and 32c are connected respectively to the RF pads 14, 17 and 18. Bias of the second potential is given to the probe 32a, and the reference potential is inputted to the probes 32b and 32c. Since the probes 32a to 32c are of the same shape as each other, positions at which the probes 32a, 32b and 32c and the RF pads 14, 17 and 18 are in contact with each other respectively are positioned on a straight line A2. It is noted that in the present embodiment, the straight line A2 passes through center parts of the RF pads 14, 17 and 18.

An End 21a of the signal line 21 is positioned on a straight line A3, and an end 22a of the signal line 22 is positioned on a straight line A4. In order to suppress the variation of the evaluation result in the RF test, a distance from the straight line A1 to the straight line A3 is equal to a distance from the straight line A2 to the straight line A4.

Figure 3:
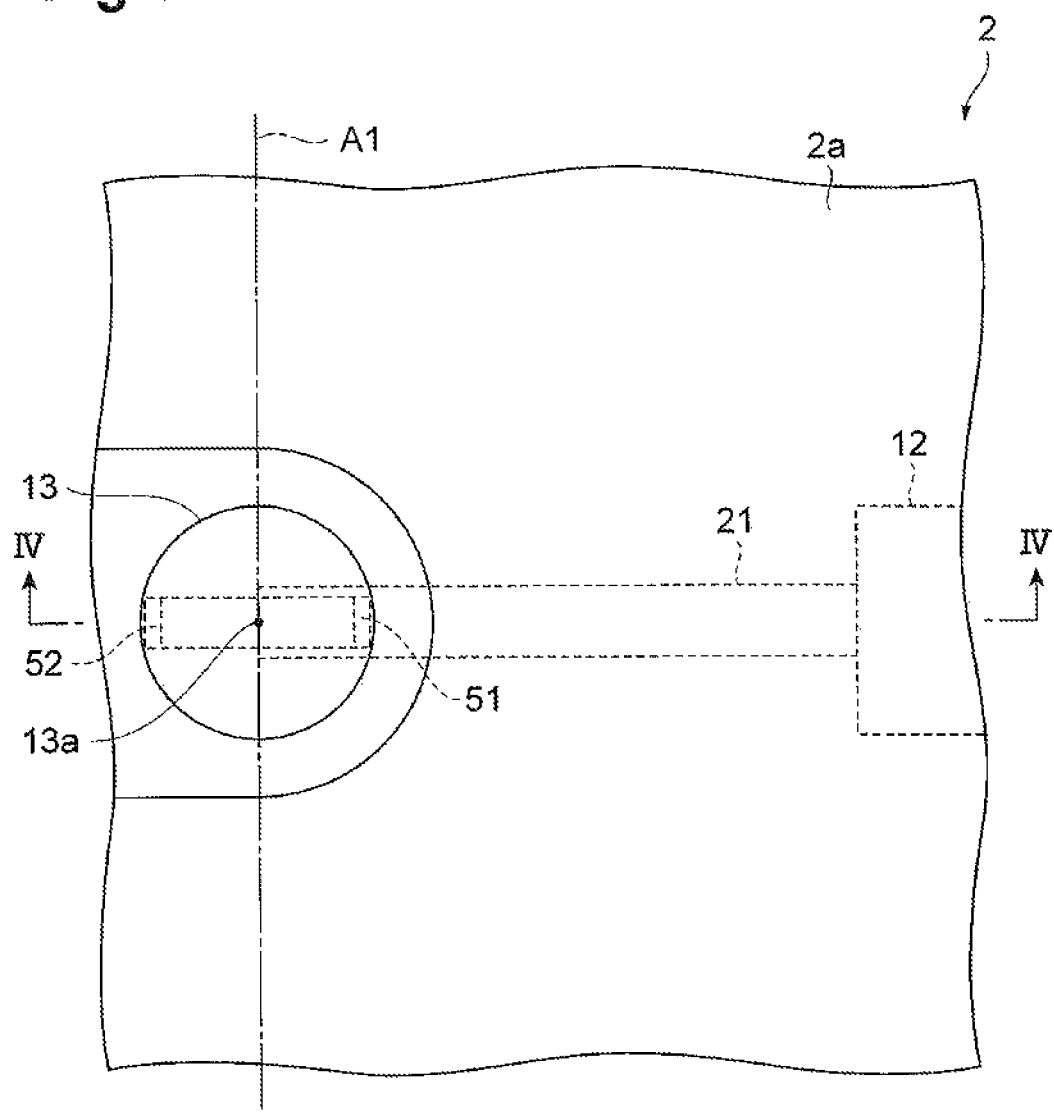
FIG. 3 is an enlarged view illustrating a part of a principal surface of the electronic device.
Figure 4:
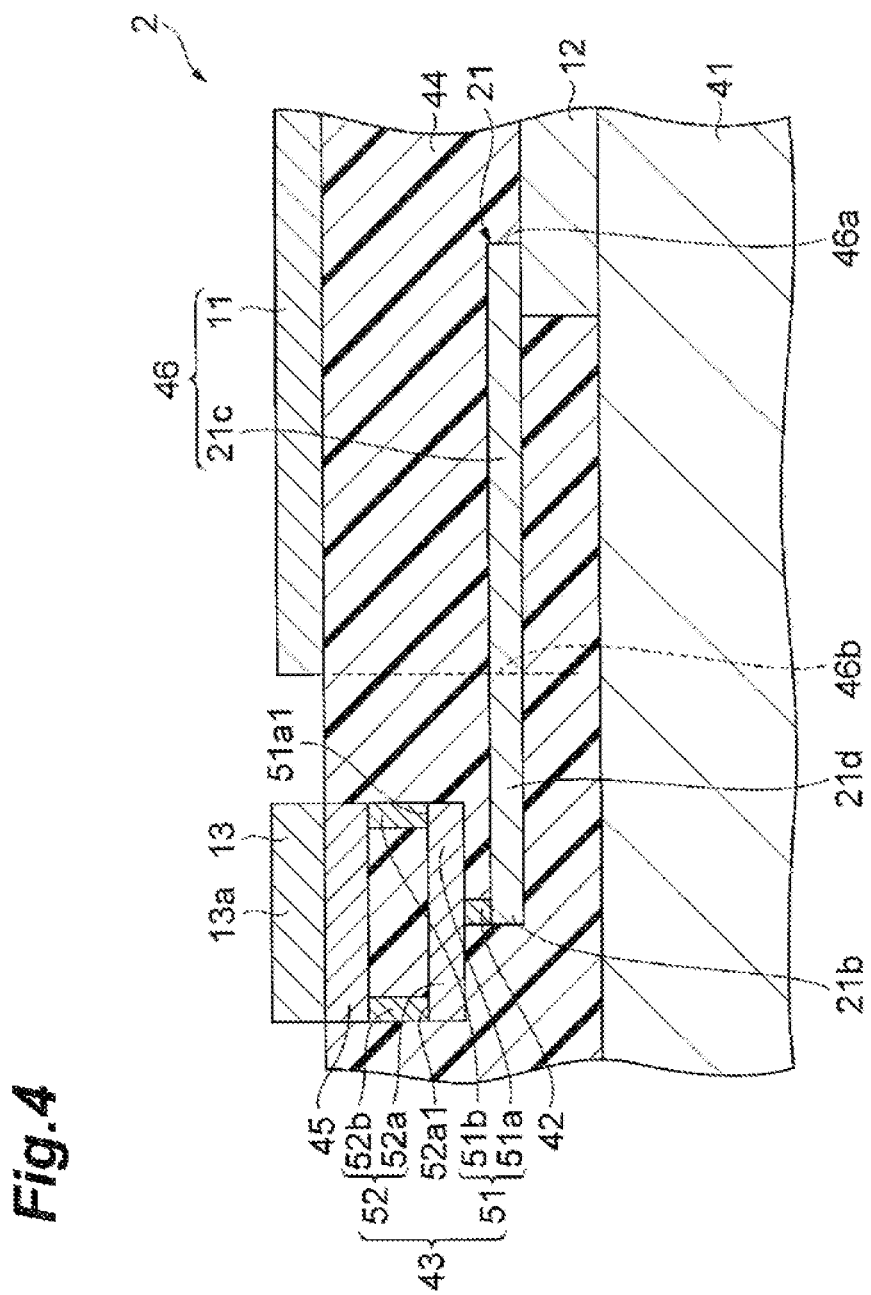
FIG. 4 is a sectional view along IV-IV in FIG. 3.

FIG. 3 is an enlarged view illustrating a part of the principal surface 2a of the electronic device 1. FIG. 4 is a sectional view along IV-IV in FIG. 3. As illustrated in FIG. 3 and FIG. 4, the body 2 includes a substrate 41, the transistor 12 formed on the substrate 41, the signal line 21 provided on the transistor 12, a via 42 provided on the end 21b of the signal line 21, a connection wiring 43 provided on the via 42, an insulating layer 44 where the transistor 12, the signal line 21 and the connection wiring 43 are embedded, a pad forming area 45 provided on the connection wiring 43, the reference pattern 11 provided on the insulating layer 44, and the RF pad 13 provided on the pad forming area 45. The substrate 41 is a GaAs substrate having a roughly rectangular planar shape, for example. The via 42 is a conductive layer made of gold (Au), for example. The insulating layer 44 is a layer made of an insulating resin such as polyimide, for example. In the present embodiment, the insulating layer 44 is formed of a plurality of polyimide layers. The pad forming area 45 is a conductive layer made of gold (Au), for example. The pad forming area 45 may have the same shape as or a different shape from that of RF pad 13.

The signal line 21 is a wiring which is made of gold (Au), for example, and connects the transistor 12 and the RF pad 13. The signal line 21 is provided inside the insulating layer 44 between the transistor 12 and the reference pattern 11. A part 21c of the signal line 21 overlapping with the reference pattern 11 is coupled with the reference pattern 11 through the insulating layer 44 surrounding the periphery thereof, and characteristic impedance of the part 21c is set at 50Ω, for example. In the present specification, the transmission line 46 includes the part 21c of the signal line 21 and the reference pattern 11. Also in the part 21c, an end connected to the transistor 12 is one end 46a of the transmission line 46, and an end not connected to the transistor 12 is the other end 46b of the transmission line 46. The part 21c in the signal line 21 is smaller in an inductor component than a part 21d other than the part 21c since the part 21c is smaller in a line length than the part 21d.

The connection wiring 43 is a wiring which is made of gold (Au), for example, and which is larger in the inductor component per unit length than the transmission line 46. The connection wiring 43 is connected with the end 21b of the signal line 21 through the via 42. The connection wiring 43 includes a first wiring 51 and a second wiring 52 branched from an upper surface of the via 42.

The first wiring 51 includes a conductive part 51a extending from the upper surface of the via 42 to the side of the transistor 12 (right side of a sheet in FIG. 4), and a via 51b provided on an end 51a1 of the conductive part 51a on the side of the transistor 12. The first wiring 51 is a multilayer wiring formed of the conductive part 51a and the via 51b. In the present embodiment, the first wiring 51 is in parallel with the signal line 21.

The second wiring 52 includes a conductive part 52a extending from the upper surface of the via 42 to the opposite side of the conductive part 51a, and a via 52b provided on an end 52a1 of the conductive part 52a on the opposite side of the side of the transistor 12. The second wiring 52 is a multilayer wiring formed of the conductive part 52a and the via 52b. In the present embodiment, the second wiring 52 is in parallel with the signal line 21.

The first wiring 51 and the second wiring 52 are branched from the center of the via 42. Also, the first wiring 51 and the second wiring 52 are of the same length as each other. The first wiring 51 and the second wiring 52 are provided point-symmetrically with respect to the center of the via 42. The first wiring 51 and the second wiring 52 are connected in parallel between the via 42 and the pad forming area 45.

The RF pad 13 is connected to the end 21b of the signal line 21 through the connection wiring 43. Specifically, the first wiring 51 and a part positioned on the side of the transistor 12 with respect to the center part 13a of the RF pad 13 are connected through the pad forming area 45. Also, the second wiring 52 and a part positioned on the opposite side of the side of the transistor 12 with respect to the center part 13a of the RF pad 13 are connected through the pad forming area 45. Therefore, both of the first wiring 51 and the second wiring 52 are connected to different positions of the RF pad 13, the first wiring 51 is connected to the part positioned on the side of one end 46a of the transmission line 46 with respect to the center part 13a of the RF pad 13, and the second wiring 52 is connected to the part positioned on the opposite side of the side of one end 46a of the transmission line 46 (or the side of the other end 46b of the transmission line 46) with respect to the center part 13a of the RF pad 13. That is, the first wiring 51 is connected near the transmission line 46 with respect to the center part 13a of the RF pad 13, and the second wiring 52 is connected to the opposite side of the transmission line 46 with respect to the center part 13a of the RF pad 13.

A part where the RF pad 13 and the via 51b overlap, and a part where the RF pad 13 and the via 52b overlap are provided along the signal line 21. As illustrated in FIG. 4, the center part 13a of the RF pad 13 overlaps with the center of the via 42 of the connection wiring 43. The first wiring 51 and the second wiring 52 are provided point-symmetrically with respect to the center part 13a of the RF pad 13. Also, as illustrated in FIG. 3, the first wiring 51 and the second wiring 52 are line-symmetrical with respect to the straight line A1 passing through the center part 13a of the RF pad 13.

Figure 5:
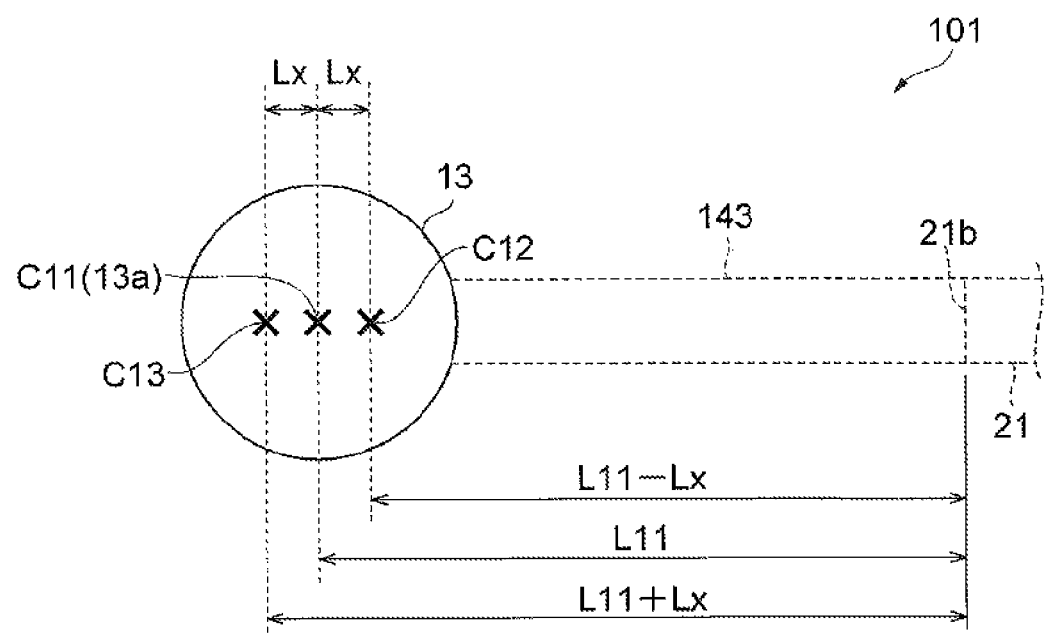
FIG. 5 is a view illustrating the RF probe brought into contact with the electronic device according to a comparative example.
Figure 6:
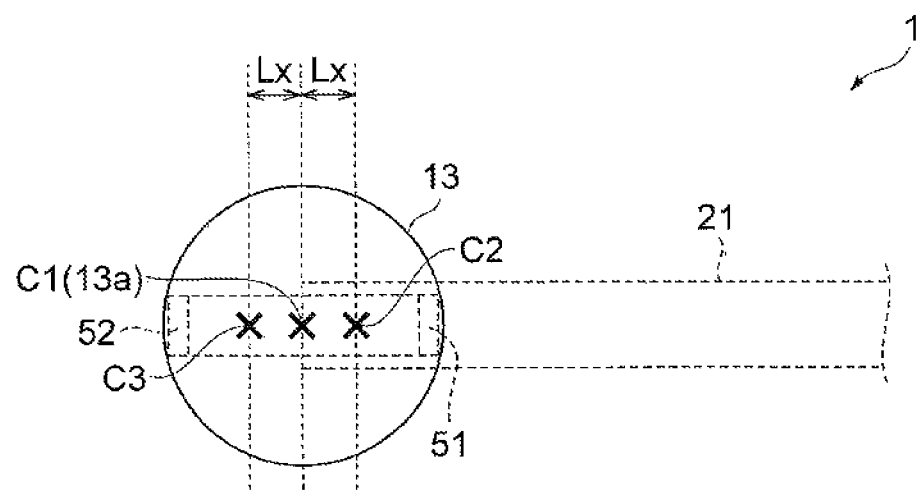
FIG. 6 is a view illustrating the RF probe brought into contact with the electronic device according to the present embodiment.
Figure 7:
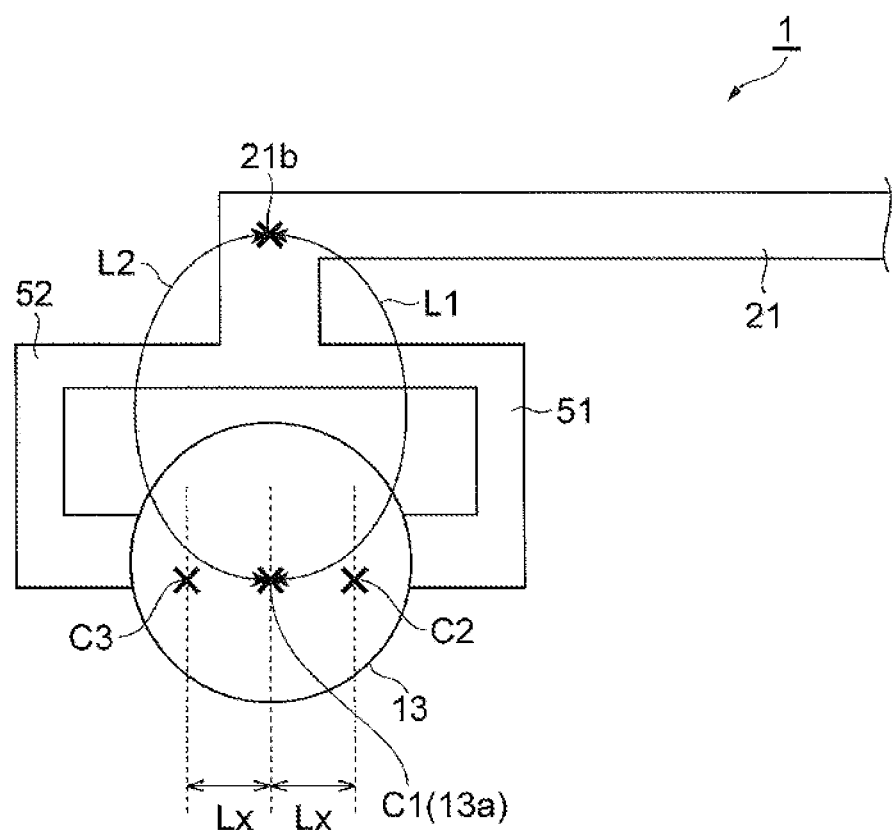
FIG. 7 is a schematic view illustrating a part of FIG. 6.

An effect obtained by the above-described electronic device 1 of the present embodiment will be described. FIG. 5 is a view illustrating an RF probe brought into contact with the electronic device according to a comparative example. FIG. 6 is a view illustrating the RF probe brought into contact with the electronic device according to the present embodiment. FIG. 7 is a schematic view illustrating FIG. 6. As illustrated in FIG. 5, in the electronic device according to the comparative example, a single connection wiring 143 is connected to a part positioned on the side of the signal line 21 with respect to the center part 13a of the RF pad 13. In the case that the RF probe is brought into contact with the RF pad 13 in the comparative example and the RF test of the transistor is conducted, the line length from contact parts C11 to C13 where the RF pad 13 and the RF probe are in contact with each other to the end 21b of the signal line 21 changes according to the positions of the contact parts C11 to C13.

For example, in the RF test of an electronic device 101 according to the comparative example, the line length from the center part 13a of the RF pad 13 to the end 21b of the signal line 21 is defined as L11. Here, in the case that the contact part C11 overlaps with the center part 13a of the RF pad 13, the line length from the contact part C11 to the end 21b of the signal line 21 becomes equal to L11. Also, in the case that the contact part C12 deviates by Lx to the side of the signal line 21 with respect to the center part 13a of the RF pad 13, the line length from the contact part C12 to the end 21b of the signal line 21 becomes L11−Lx. In the case that the contact part C13 deviates by Lx to the opposite side of the side of the signal line 21 with respect to the center part 13a of the RF pad 13, the line length from the contact part C13 to the end 21b of the signal line 21 becomes L11+Lx. That is, in the comparative example, a line length difference of 2Lx at a maximum is generated depending on the positions of the contact parts C11 to C13. For example, when it is set that Lx is set at 10 μm and the electronic device 101 is used in millimeter wave band of 60 GHz or higher, a difference of a frequency band of about 6 GHz is generated between the case of the contact part C12 and the case of the contact part C13. Therefore, in the case that the RF test is conducted by a manual operation, by the deviation of the contact part, the variation of the evaluation result of the RF characteristic is generated, and an error in circuit design is generated.

In contrast, as illustrated in FIG. 6 and FIG. 7, in the electronic device 1 according to the present embodiment, the RF pad 13 is connected to the end 21b of the signal line 21 through the first wiring 51 and the second wiring 52. As illustrated in FIG. 7, the line length from the center part 13a to the end 21b through the first wiring 51 is defined as L1, and the line length from the center part 13a to the end 21b through the second wiring 52 is defined as L2. In this case, characteristic impedance from the center part 13a to the end 21b is a composite value of the impedance of the line through the first wiring 51 and the impedance of the line through the second wiring 52. The impedance of the line depends on inductance of the line, and the inductance is proportional to a line length. Therefore, the composite value is a parallel value of the line lengths of the both lines, L1∥L2. Also, as illustrated in FIG. 6 and FIG. 7, in the case that the contact part C2 deviates by Lx to the side of the signal line 21 with respect to the center part 13a of the RF pad 13, the impedance of the line from the contact part C2 to the end 21b of the signal line 21 is proportional to (L1−Lx)/(L2+Lx). In the case that the contact part C3 deviates by Lx to the opposite side of the side of the signal line 21 with respect to the center part 13a of the RF pad 13, the impedance of the line from the contact part C3 to the end 21b is proportional to (L1+Lx)/(L2−Lx).

Here, a distance from the center part 13a of the RF pad 13 to the end 21b is set at 100 μm, and the deviation. Lx of a contact part is set at 20 μm. In this case, the impedance from the contact part C2 to the end 21b is proportional to (L1−Lx)/(L2+Lx), and the impedance from the contact part C3 to the end 21b is proportional to (L1+Lx)/(L2−Lx), and both become about 99 μm. Therefore, in the present embodiment, even if the contact part deviates from the center part 13a of the RF pad 13, the impedance based on the line from the contact part to the end 21b of the signal line 21 becomes the parallel value of the impedance relating to the two routes, and the variation becomes smaller. From the above, even in the case that the RF test is conducted by a manual operation, since the variation of impedance by the variation of the line length through the transmission line 46 from the contact part to the transistor 12 as an object to be tested becomes smaller, the variation of the evaluation result of the RF characteristic is suppressed. Also, the RF test can be accurately conducted, and generation of an error in circuit design can be suppressed.

Also, the first wiring 51 and the second wiring 52 may be point-symmetrical with respect to the center part 13a of the RF pad 13, or line-symmetrical with respect to the straight line A1 passing through the center part 13a of the RF pad 13. In this case, the line length from the center part 13a of the RF pad 13 to the first wiring 51 becomes equal to the line length from the center part 13a of the RF pad 13 to the second wiring 52. Therefore, the variation of the impedance from the contact part to the transistor 12 becomes smaller.

Also, the first wiring 51 and the second wiring 52 may be of the same length as each other. In this case, the combined line length of the first wiring 51 and the signal line 21 becomes equal to the combined line length of the second wiring 52 and the signal line 21. Therefore, the variation of the impedance from the contact part to the transistor 12 becomes smaller.

Also, as illustrated in FIG. 4, the first wiring 51 and the second wiring 52 are embedded in the insulating layer 44 between the RF pad 13 and the substrate 41. Thus, an area for routing of the first wiring 51 and the second wiring 52 can be reduced, and high integration and miniaturization of an element become possible.

Figure 8:
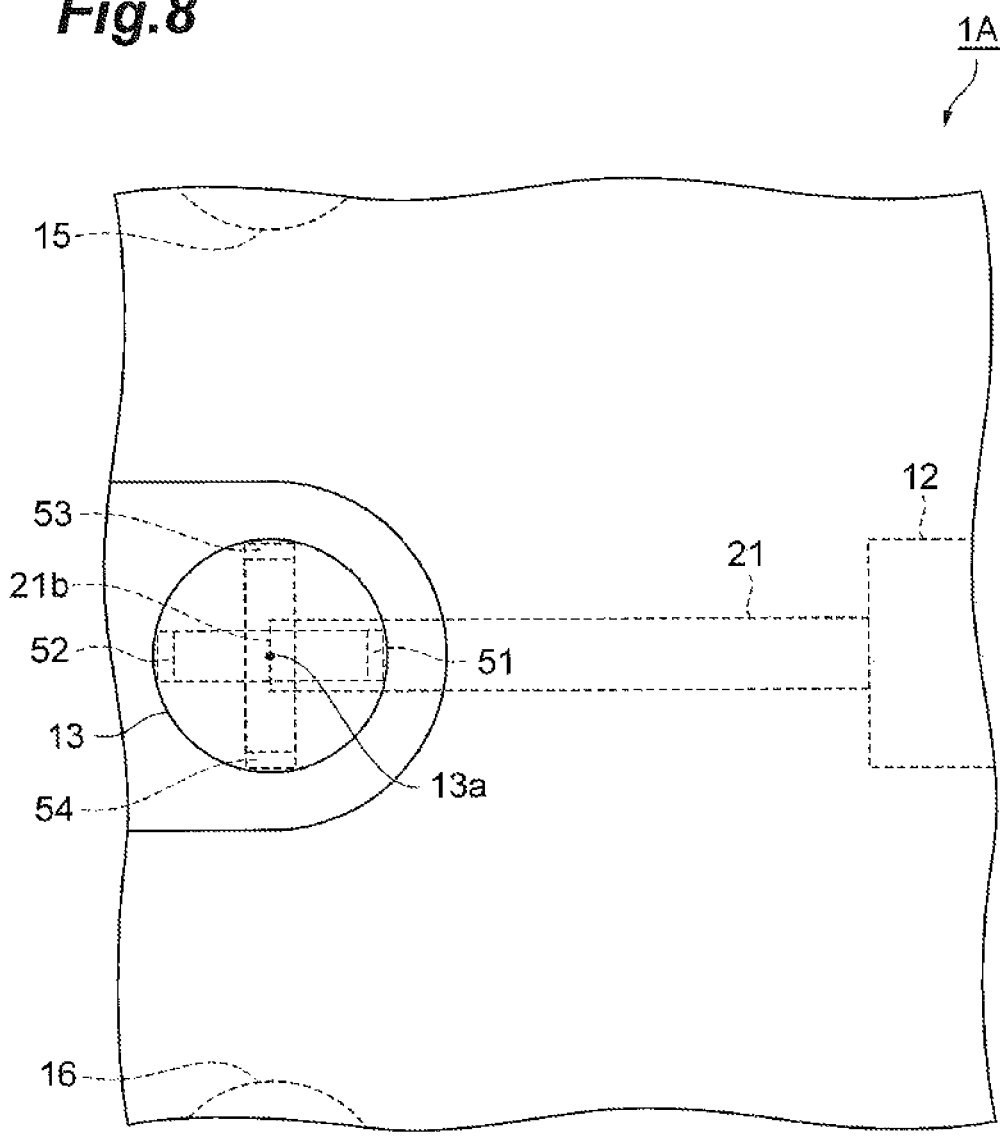
FIG. 8 is an enlarged plan view illustrating a part of a principal surface of an electronic device in a first modification.
Figure 9:
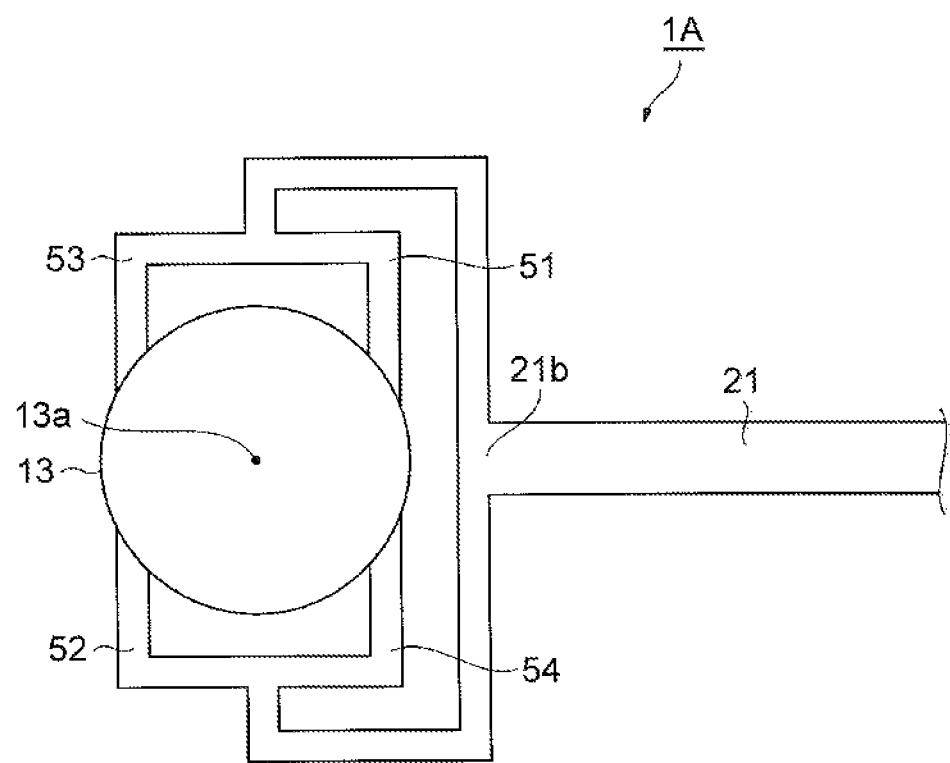
FIG. 9 is a schematic view illustrating a part of FIG. 8.

FIG. 8 is an enlarged plan view illustrating a part of a principal surface of an electronic device 1A in a first modification. FIG. 9 is a schematic view illustrating a part of FIG. 8. As illustrated in FIG. 8 and FIG. 9, the RF pad 13 of the electronic device 1A is connected to the signal line 21 through the first wiring 51, the second wiring 52, a third wiring 53 and a fourth wiring 54 that are in parallel relation to each other. Specifically, as illustrated in FIG. 8, a part on the side of the RF pad 15 with respect to the center part 13a of the RF pad 13 and the third wiring 53 are connected, and a part on the side of the RF pad 16 with respect to the center part 13a of the RF pad 13 and the fourth wiring 54 are connected. The third wiring 53 and the fourth wiring 54 are branched from the center of the via 42 similarly to the first wiring 51 and the second wiring 52. Also, the third wiring 53 and the fourth wiring 54 are of the same length, and are point-symmetrical with respect to the center part 13a. Even in this case, the functions equivalent to those in a first embodiment are accomplished. Further, as illustrated in FIG. 9, the impedance from the RF pad 13 to the signal line 21 becomes the composite value (parallel value) of four line lengths through the first wiring 51, the second wiring 52, the third wiring 53 and the fourth wiring 54. Therefore, in the RF test, even in the case that the contact part where the probe head 31 and the RF pad 13 are in contact with each other deviates in an arbitrary direction from the center part 13a, the variation of the impedance from the contact part to the end 21b of the signal line 21 becomes smaller.

Figure 10:
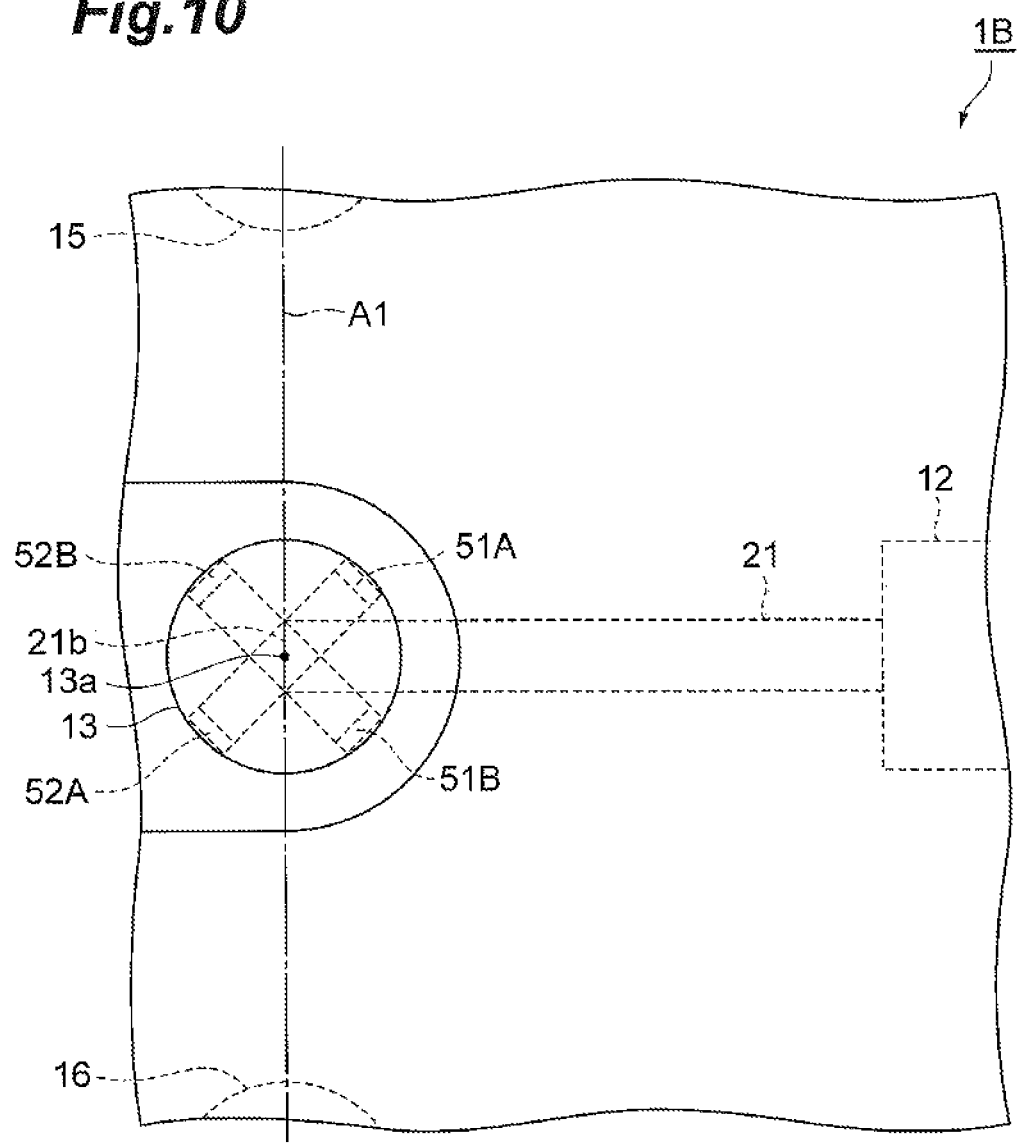
FIG. 10 is an enlarged view illustrating a part of a principal surface of an electronic device in a second modification.

FIG. 10 is an enlarged view illustrating a part of a principal surface of an electronic device according to a second modification. As illustrated in FIG. 10, the RF pad 13 of an electronic device 1B is connected to the signal line 21 through the first wirings 51A, 51B and the second wirings 52A, 52B that are in the parallel relation to each other. Specifically, the first wiring 51A is connected to a part on the side of the transistor 12 and on the side of the RF pad 15, and the first wiring 51B is connected to a part on the side of the transistor 12 and on the side of the RF pad 16, with respect to the center part 13a of the RF pad 13. The second wiring 52A is connected to a part on the opposite side of the side of the transistor 12 and on the side of the RF pad 16, and the second wiring 52B is connected to a part on the opposite side of the side of the transistor 12 and on the side of the RF pad 15, with respect to the center part 13a of the RF pad 13. Also, the first wiring 51A and the second wiring 52A are of the same length as each other, and are point-symmetrical with respect to the center part 13a. The first wiring 51B and the second wiring 52B are of the same length as each other, and are point-symmetrical with respect to the center part 13a. Also, the first wirings 51A, 51B and the second wirings 52A, 52B are line-symmetrical with respect to the straight line A1. Even in this case, the functions equivalent to those in the first embodiment are accomplished. Further, when the RF pad 13 and the individual wirings in FIG. 10 are schematically illustrated, the configuration is equivalent to that of FIG. 9. Also, the first wirings 51A, 51B and the second wirings 52A, 52B may be of the same length as each other.

Figure 11:
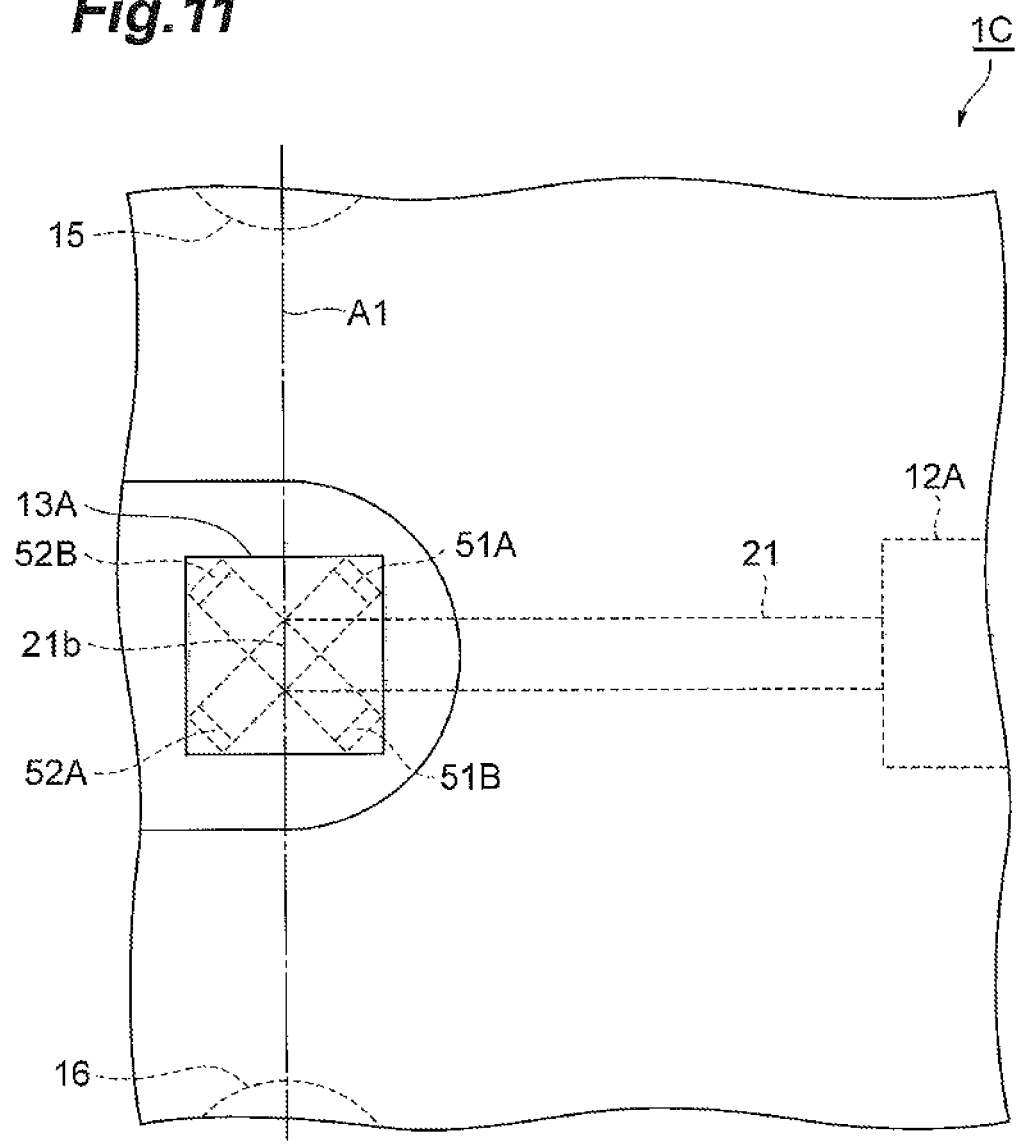
FIG. 11 is an enlarged view illustrating a part of a principal surface of an electronic device in a third modification.

FIG. 11 is an enlarged view illustrating a part of a principal surface of an electronic device in a third modification. As illustrated in FIG. 11, an RF pad 13A of an electronic device IC has a rectangular planar shape, and is connected to the signal line 21 through the first wirings 51A, 51B and the second wirings 52A, 52B that are in the parallel relation to each other. Even in this case, the functions equivalent to those in the first embodiment are accomplished. Further, when the RF pad 13A and the individual wirings in FIG. 11 are schematically illustrated, the configuration is equivalent to those in FIG. 9. Therefore, the third modification accomplishes the functions equivalent to those in the first modification and the second modification. Also, the shape of the RF pad 13A may be not only a rectangle (a square shape, a rectangular shape, a diamond shape, a parallelogram shape or the like) but also a polygonal shape (a hexagonal shape or an octagonal shape, for example) or an elliptic shape.

Figure 12:
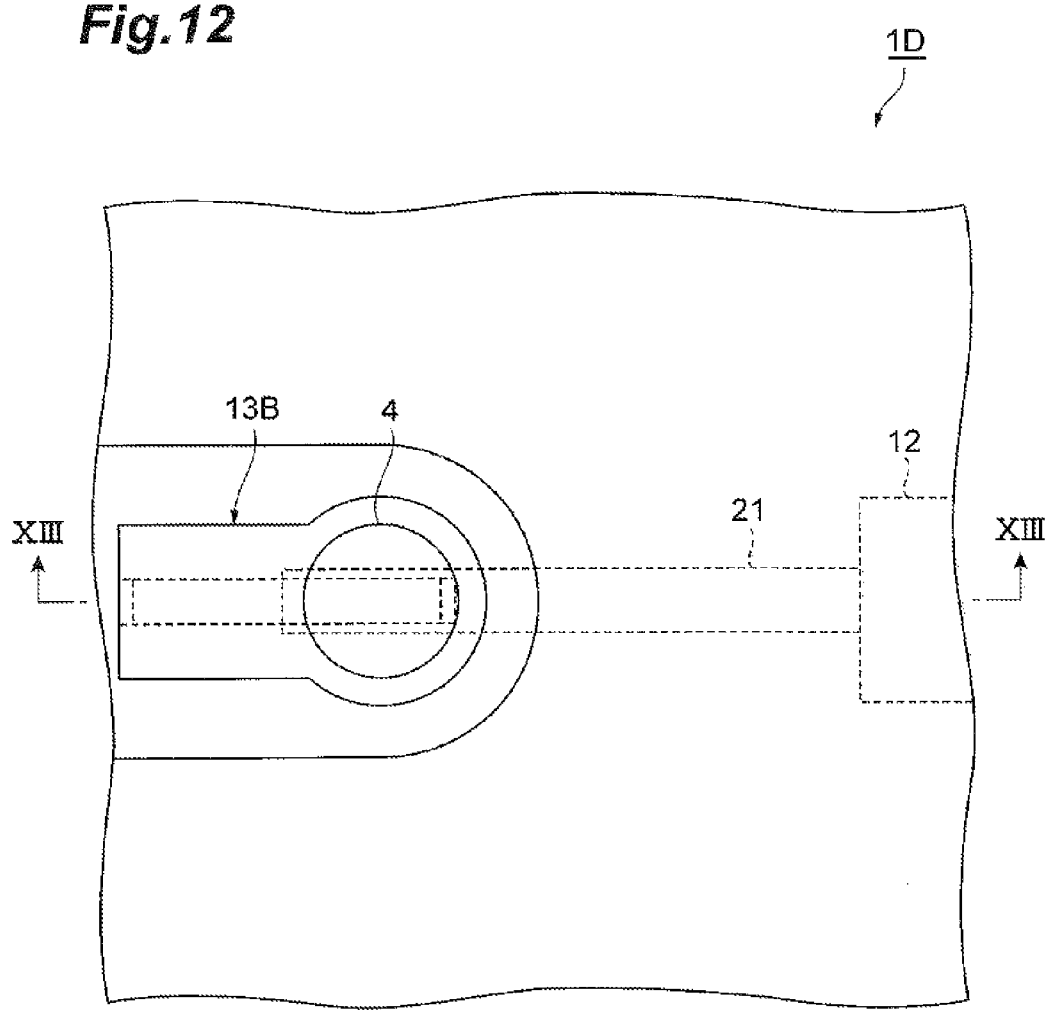
FIG. 12 is an enlarged view illustrating a part of a principal surface of an electronic device in a fourth modification.
Figure 13:
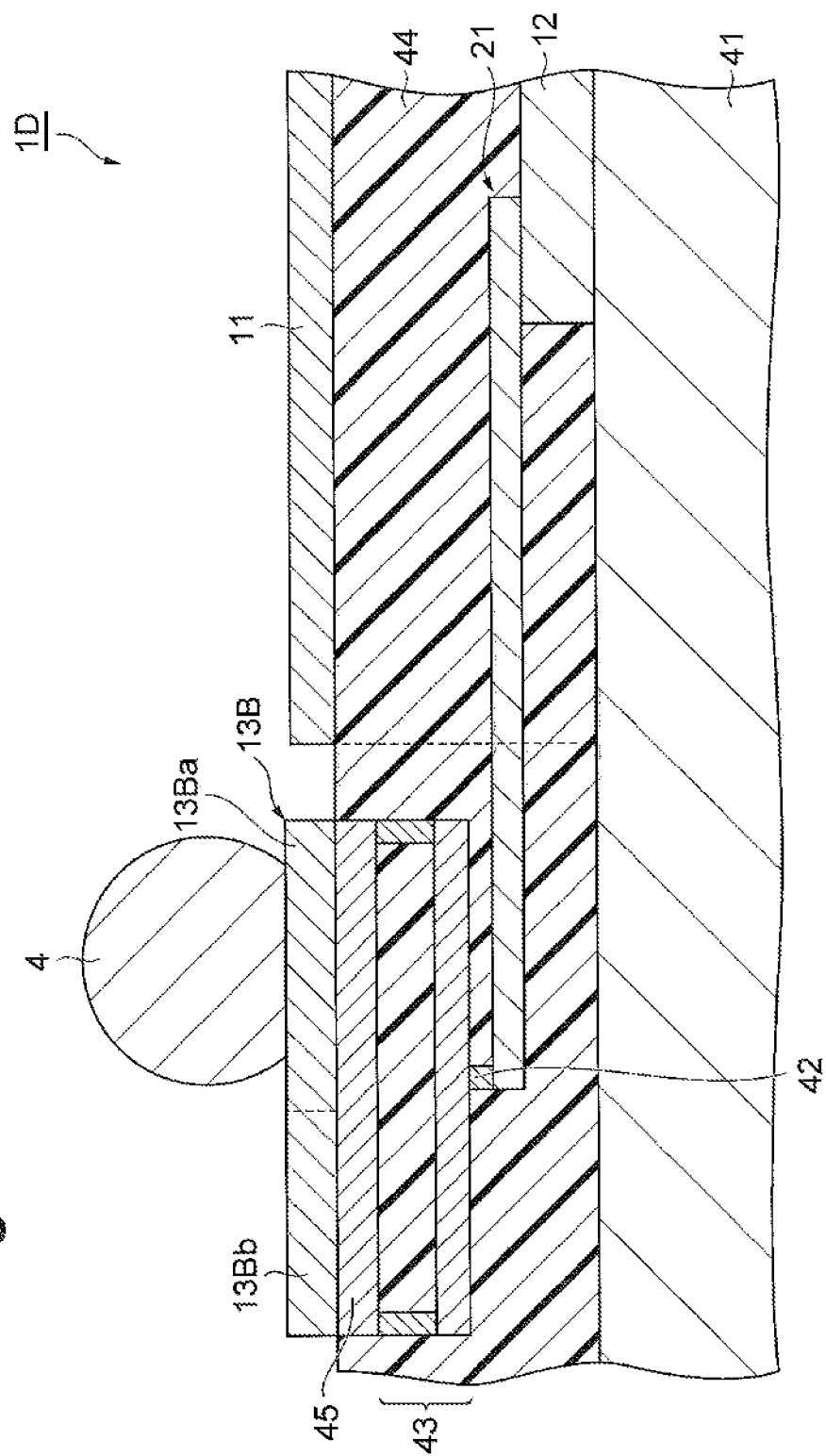
FIG. 13 is a sectional view along in FIG. 12.

FIG. 12 is an enlarged view illustrating a part of a principal surface of an electronic, device in a fourth modification. FIG. 13 is a sectional view along XIII-XIII in FIG. 12. As illustrated in FIG. 12 and FIG. 13, on an area 13Ba of a part of an RF pad 13B of the electronic device 1D, the solder ball 4 is provided. Also, the RF pad 13B has an area 13Bb where the solder ball 4 is not formed in addition to the area 13Ba. The area 13Bb is positioned on the opposite side of the side of the transistor 12 with respect to the area 13Ba. Thus, for example, even after the solder ball 4 is provided on the RF pad 13B, or after all steps of fabricating the electronic device 1D are completed, the RF test can be conducted by bringing the RF probe into contact with the area 13Ba. Also, even in this case, effects equivalent to those in the first embodiment are accomplished.

EXAMPLES

The present invention will be described further in detail by the following examples, however, the present invention is not limited to these examples.

Example

Figure 14:
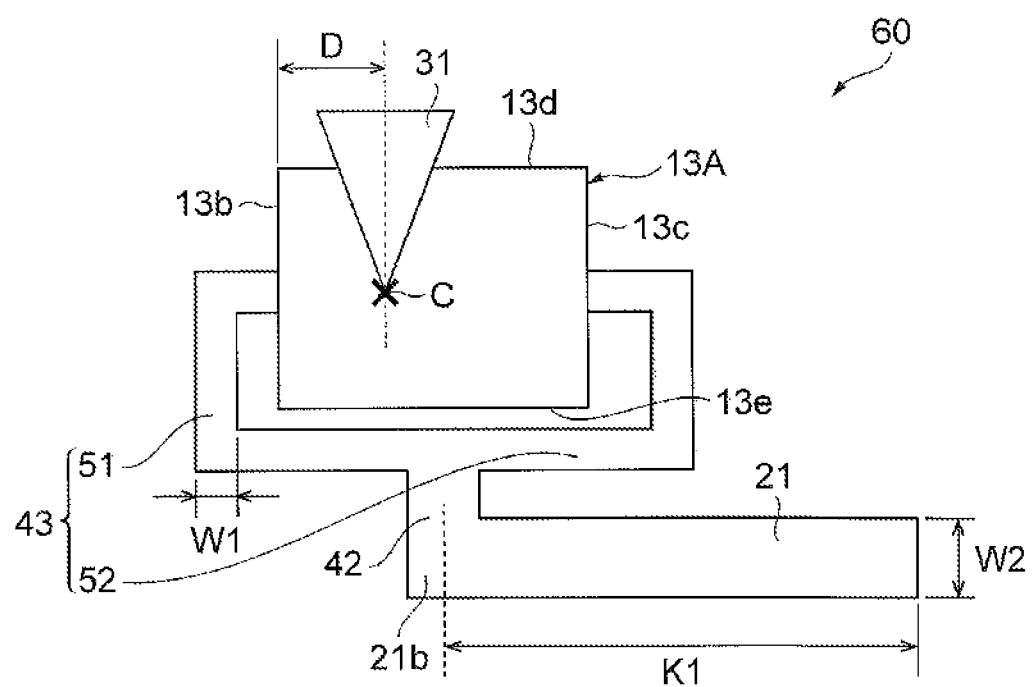
FIG. 14 is a schematic view illustrating an evaluation terminal connected to the RF probe of an example.

FIG. 14 is a schematic view illustrating an evaluation terminal connected to the RF probe. First, as illustrated in FIG. 14, an evaluation terminal 60 including the RF pad 13A, the signal line 21, and the connection wiring 43 including the via 42, the first wiring 51 and the second wiring 52 is prepared. The RF pad 13A, the signal line 21, and the connection wiring 43 are turned to the conductive layer made of gold (Au). The RF pad 13A is connected to the end 21b of the signal line 21 through the first wiring 51 and the second wiring 52 in the parallel relation to each other. Specifically, the first wiring 51 is connected to a side 13b of the RF pad 13A, and the second wiring 52 is connected to a side 13c opposite to the side 13b of the RF pad 13A. Also, the first wiring 51 and the second wiring 52 are provided point-symmetrically about the center part 13a of the RF pad 13A. The opposite side of the end 21b of the signal line 21 is connected to the transmission line having the characteristic impedance of 50Ω.

The RF pad 13A is assumed to be the rectangular planar shape, and lengths of the individual sides 13b to 13e are assumed to be each set at 80 µm. For each of a combined structure of the first wiring 51 and the via 42 and a combined structure of the second wiring 52 and the via 42, a width W1 is set at 6 µm and a length is set at 100 µm, and for the signal line 21, a width W2 is set at 19 µm and a length K1 is set at 50 µm. Also, in the case that the individual wiring and the RF pad 13A in the evaluation terminal 60 are laminated through the insulating layer, the insulating layer is turned to a polyimide layer whose relative dielectric constant is 6. Also, thicknesses of the RF pad 13A, the signal line 21, the connection wiring 43 and the insulating layer are not taken into consideration.

Also, an interval between the contact part C where the probe head 31 is in contact with the RF pad 13A and the side 13b of the RF pad 13A is defined as D. In the case that the contact part C is in contact with the side 13b, the interval D is 0 µm. In the case that the contact part C is in contact with the side 13c, the interval D is 80 µm. Therefore, a range of the interval D is equal to or longer than 0 µm and equal to or shorter than 80 µm. Also, the transmission line of the probe head 31 has the characteristic impedance of 50Ω.

Figure 15:
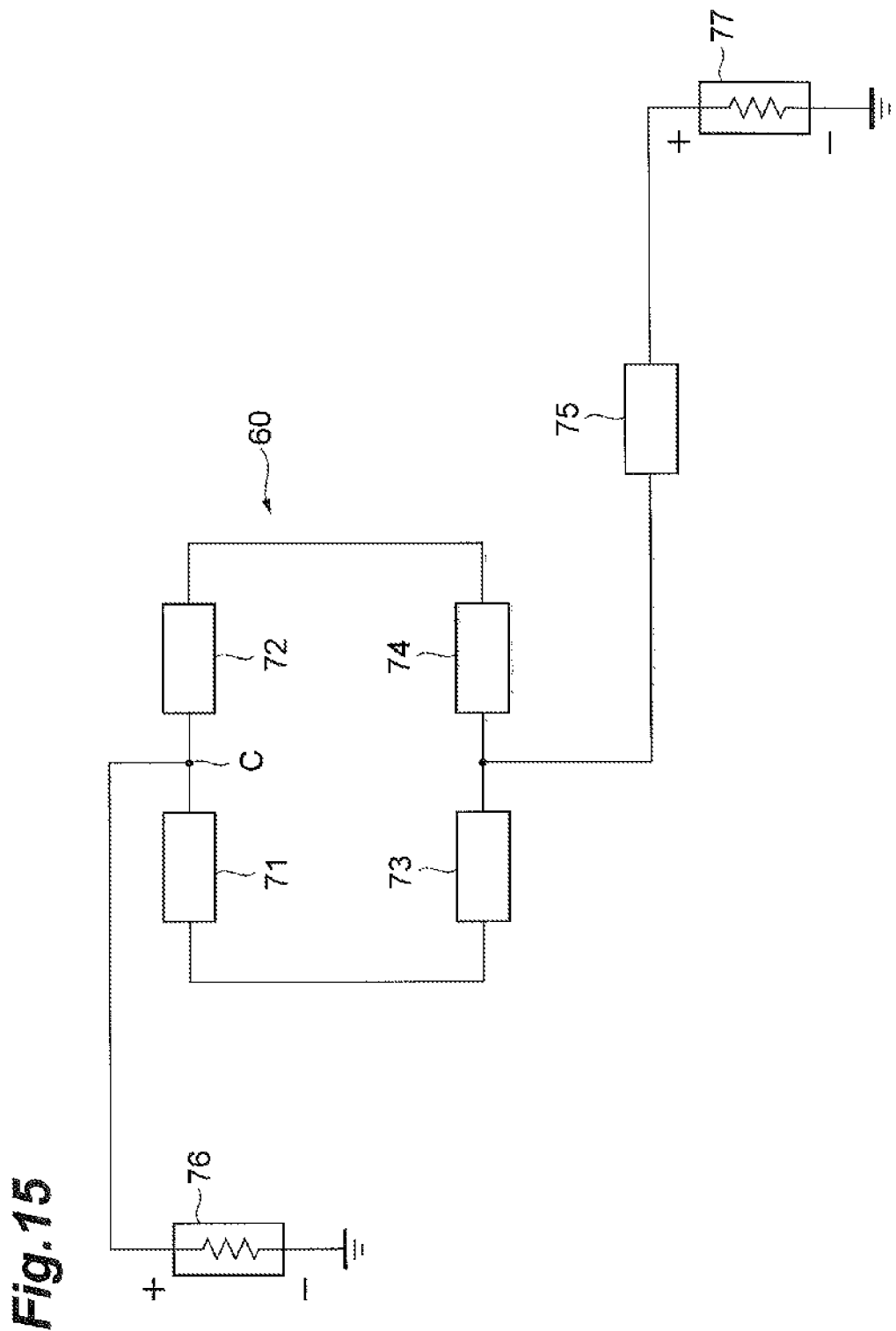
FIG. 15 is a diagram illustrating an equivalent circuit of FIG. 14.

FIG. 15 is a diagram illustrating an equivalent circuit of FIG. 14. As illustrated in FIG. 15, the evaluation terminal 60 includes blocks 71 to 75. The block 71 corresponds to an area from the side 13b to the contact part C of the RF pad 13A. The block 72 corresponds to an area from the contact part C to the side 13c of the RF pad 13A. The block 73 corresponds to a combined wiring of the first wiring 51 and the via 42. The block 74 corresponds to a combined wiring of the second wiring 52 and the via 42. The block 75 corresponds to the signal line 21. A block 76 corresponds to the probe head 31. A block 77 corresponds to the signal line 21 at a part covered with the reference pattern 11.

Comparative Example

Figure 16:
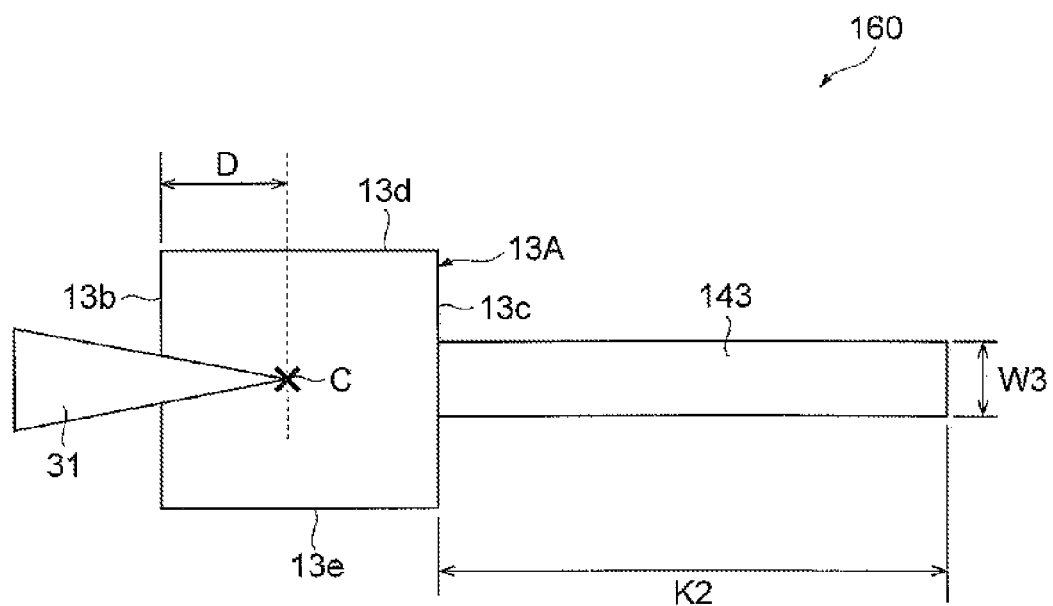
FIG. 16 is a schematic view illustrating an evaluation terminal connected to the RF probe of the comparative example.

FIG. 16 is a schematic view illustrating an evaluation terminal according to the comparative example. As illustrated in FIG. 16, an evaluation terminal 160, which is set on the same conditions as those of the evaluation terminal 60 in the example except that a wiring connecting the RF pad 13A and the signal line 21 is a single connection wiring 143, is prepared. Also, a width W3 of the connection wiring 143 is set at 19 µm, and a length K2 is set at 100 µm. Similarly to the example, the probe head 31 is brought into contact with the transmission line having the characteristic impedance of 50Ω.

Figure 17:
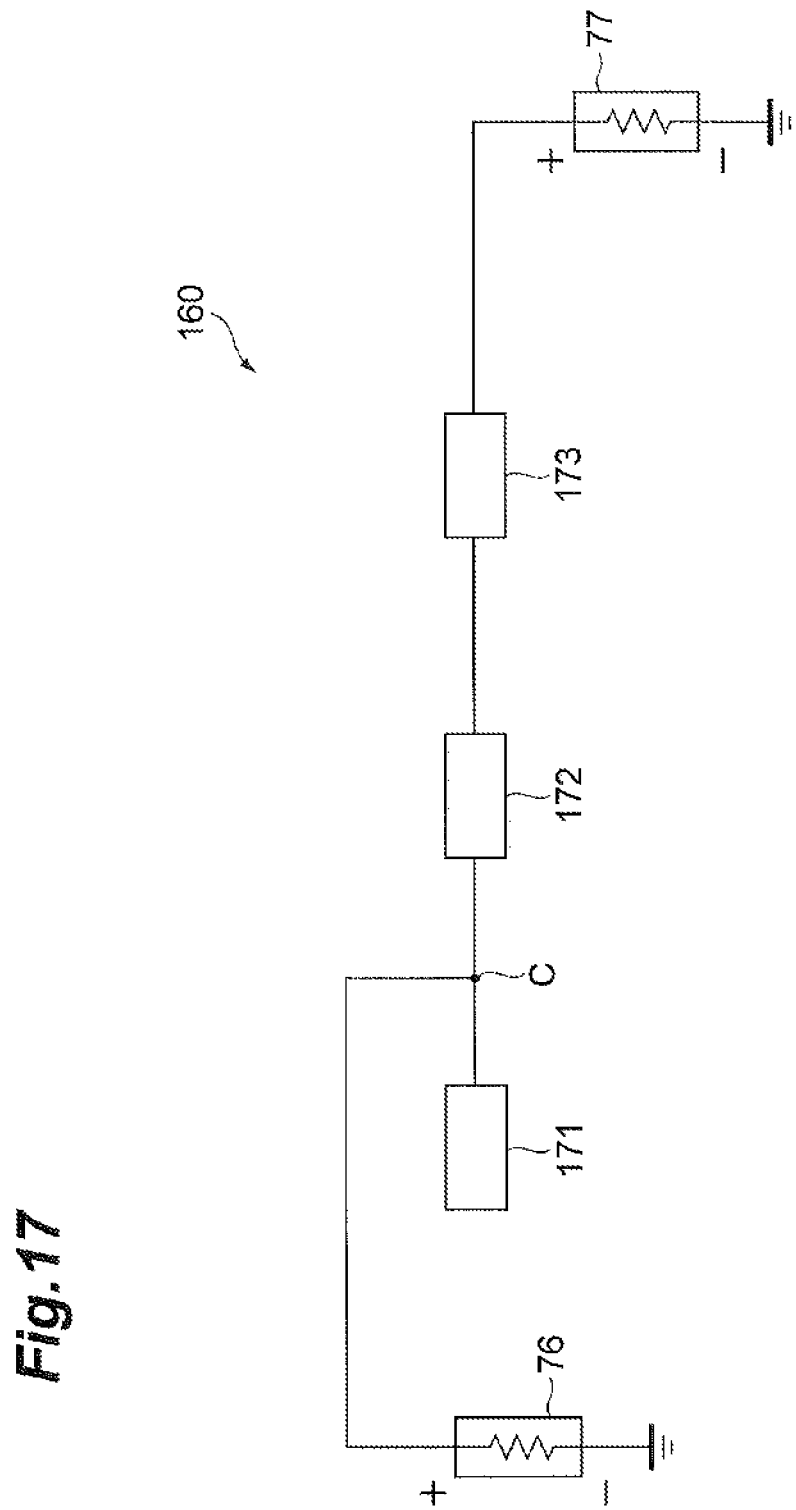
FIG. 17 is a diagram illustrating the equivalent circuit of FIG. 16.

FIG. 17 is a diagram illustrating an equivalent circuit of FIG. 16. As illustrated in FIG. 17, the evaluation terminal 160 includes blocks 171 to 173. The block 171 corresponds to the area from the side 13b to the contact part C in the RF pad 13A. The block 172 corresponds to the area from the contact part C to the side 13c. The block 173 corresponds to the combined wiring of the connection wiring 143 and the signal line 21.

(RF Test)

For the evaluation terminal 60 according to the example and the evaluation terminal 160 according to the comparative example, the RF test is conducted respectively. In the RF test, the high frequency signal is inputted to the RF pad 13A through the probe head 31, and the high frequency signal leaking out from the RF pad 14 is detected through the probe head 32. Then, by changing the interval D between the side 13b of the RF pad 13A and the contact part, variation of isolation of the evaluation terminals 60 and 160 at a predetermined frequency is evaluated. The isolation is indicated by a input power/output power ratio (decibels (dB)). The smaller the variation of a value of the isolation accompanying the change of the interval D is, the smaller the variation of the RF characteristic inside the evaluation terminal is.

Figure 18:
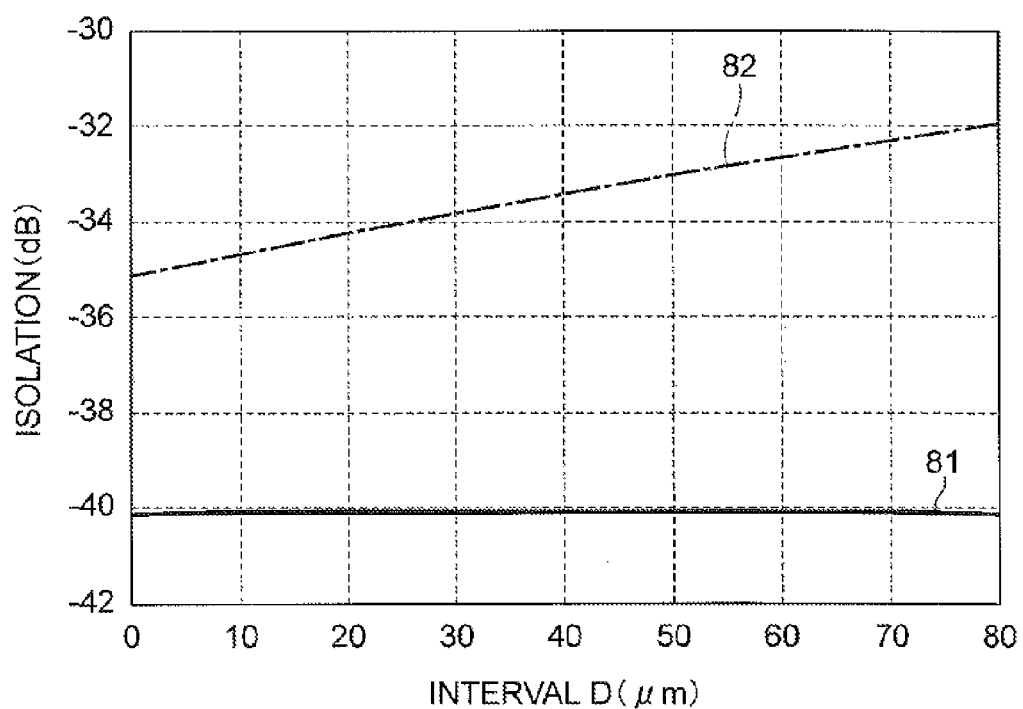
FIG. 18 is a graph illustrating isolation in the case that a frequency of high frequency signals is 50 GHz.

FIG. 18 illustrates an evaluation result of the isolation in the case that a frequency of the high frequency signal is set at 50 GHz. In FIG. 18, the vertical axis indicates the isolation, and the horizontal axis indicates the length of the interval D. As illustrated in FIG. 18, isolation 81 of the evaluation terminal 60 according to the example indicated about −40 dB which is a roughly fixed value even when the interval D changed. On the other hand, isolation 82 of the evaluation terminal 160 according to the comparative example change corresponding to the change of the interval D. Specifically, the isolation indicated about −35 dB in the case that the interval D is 0 μm, and the isolation indicated about −32 dB in the case that the interval D is 80 μm. It is confirmed that, in the case that the frequency of the high frequency signal is 50 GHz, the evaluation terminal 60 according to the example is smaller in the variation of the RF characteristic than the evaluation terminal 160 according to the comparative example.

Figure 19:
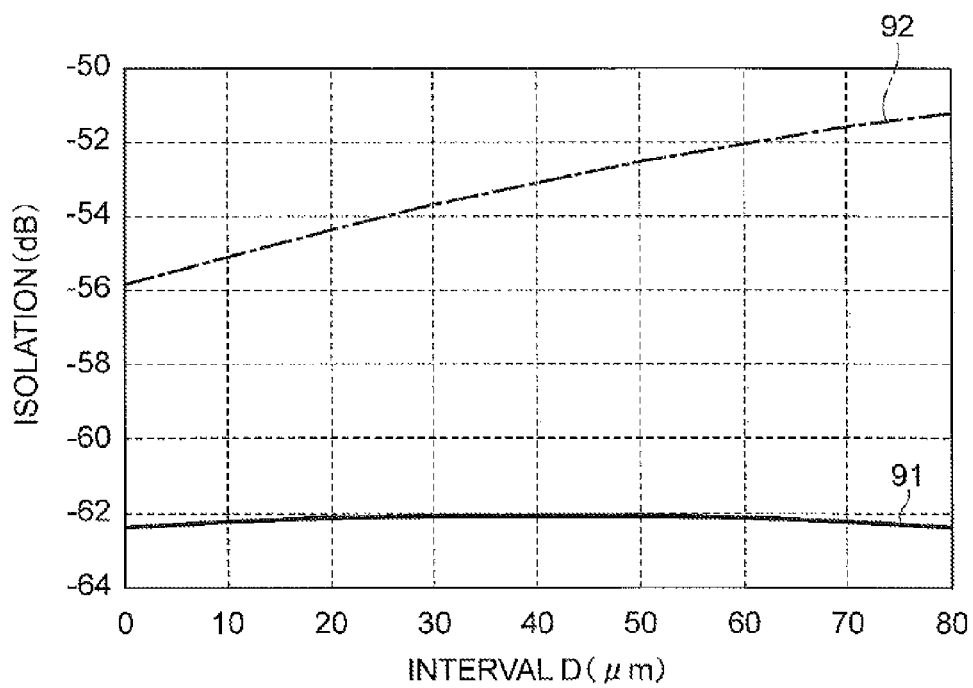
FIG. 19 is a graph illustrating isolation in the case that the frequency of the high frequency signals is 80 GHz.

FIG. 19 illustrates the isolation in the case that the frequency of the high frequency signal is set at 80 GHz. As illustrated in FIG. 19, isolation 91 in the evaluation terminal 60 according to the example indicated about −62 dB which is a roughly fixed value even when the interval D changed. On the other hand, isolation 92 in the evaluation terminal 160 according to the comparative example change corresponding to the change of the interval D. Specifically, the isolation indicated about −56 dB in the case that the interval D is 0 μm, and the isolation indicated about −51 dB in the case that the interval D is 80 μm, it is confirmed that, also in the case that the frequency of the high frequency signal is 80 GHz, the evaluation terminal 60 according to the example is smaller in the variation of the RF characteristic than the evaluation terminal 160 according to the comparative example.

The electronic device according to the present invention is not limited to the embodiment, the modifications and the examples described above, and other various modifications are possible. For example, described contents of the embodiment and the modifications described above may be appropriately combined. In the embodiment and the modifications described above, the pad forming area 45 may not be always provided on the connection wiring 43. Also, the pad forming area 45 and the RF pad 13 may be in common.

The first wiring 51 to the fourth wiring 54 included in the connection wiring 43 may not be always of the same length, and may not be always provided point-symmetrically or line-symmetrically. Also, the connection wiring 43 may include the other wiring in addition to the first wiring 51 to the fourth wiring 54. Also, the connection wiring 43 may include the plurality of wirings to be an even number, or may include the plurality of wirings to be an odd number.

What is claimed is:

1. An electronic device comprising:
    a transistor provided on a substrate;
    a transmission line provided on the substrate and connected to the transistor;
    an electrode pad connected to the transmission line; and
    a connection wiring electrically connecting the electrode pad and the transmission line through a first wiring and a second wiring,
    wherein both of the first wiring and the second wiring are connected to different portions of the electrode pad.

2. The electronic device according to claim 1,
    wherein the first wiring and the second wiring are connected in parallel between the electrode pad and the transmission line.

3. The electronic device according to claim 1,
    wherein the first wiring and the second wiring are larger in an inductor component per unit length than the transmission line.

4. The electronic device according to claim 1,
    wherein the transmission line includes one end connected to the transistor and the other end connected to the electrode pad,
    wherein the first wiring is connected to a first part positioned on a side of the one end of the transmission line with respect to a center part of the electrode pad, and
    wherein the second wiring is connected to a second part positioned on an opposite side to the side of the one end of the transmission line with respect to the center part of the electrode pad.

5. The electronic device according to claim 4,
    wherein the first wiring and the second wiring are point-symmetrical with respect to the center part of the electrode pad, or line-symmetrical with respect to a straight line, and
    wherein the straight line extends in a direction orthogonal to the transmission line and passes through the center part of the electrode pad.

6. The electronic device according to claim 1,
    wherein the first wiring and the second wiring are of the same length as each other.

7. The electronic device according to claim 1,
    wherein each of the first wiring and the second wiring includes a via.

8. The electronic device according to claim 1,
    wherein a solder ball configured to connect the transistor to an external device is provided on a part of the electrode pad.

9. The electronic device according to claim 1, wherein the connection wiring electrically connecting the electrode pad and the transmission line further comprises a third wiring, and wherein the first wiring, the second wiring, and the third wiring are connected to different portions of the electrode pad.

* * * * *